(12) United States Patent
Kato et al.

(10) Patent No.: US 8,031,124 B2
(45) Date of Patent: Oct. 4, 2011

(54) CONTAINER WITH ELECTROMAGNETIC COUPLING MODULE

(75) Inventors: Noboru Kato, Moriyama (JP); Norio Sakai, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/426,369

(22) Filed: Apr. 20, 2009

(65) Prior Publication Data
US 2009/0201117 A1 Aug. 13, 2009

Related U.S. Application Data

(63) Continuation of application No. PCT/JP2008/050945, filed on Jan. 24, 2008.

(30) Foreign Application Priority Data

Jan. 26, 2007 (JP) ................... 2007-016860

(51) Int. Cl.
  *H01Q 1/38* (2006.01)
(52) U.S. Cl. ..................... 343/702; 340/572.7
(58) Field of Classification Search .......... 343/702, 343/713, 860, 700 MS, 850; 340/572.7
  See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,757,074 A | 5/1998 | Matloubian et al. |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,611 A | 8/2000 | Lastinger |
| 6,107,920 A | 8/2000 | Eberhardt et al. |
| 6,172,608 B1 | 1/2001 | Cole |

(Continued)

FOREIGN PATENT DOCUMENTS

EP  0 694 874 A2  1/1996

(Continued)

OTHER PUBLICATIONS

Official communication issued in Japanese Application No. 2007-531524, mailed on Sep. 11, 2007.

(Continued)

*Primary Examiner* — Michael C Wimer
(74) *Attorney, Agent, or Firm* — Keating & Bennett, LLP (57) ABSTRACT

A container includes an electromagnetic coupling module on an inner surface of a container main body and a radiator made of a metal material on an outer surface of the container main body. The electromagnetic coupling module includes a feeder circuit board, on which a radio IC chip is mounted and in which a feeder circuit including a resonant circuit that has a predetermined resonant frequency and includes an inductance element is provided. The electromagnetic coupling module and the radiator preferably transmit and receive high-frequency signals through electromagnetic coupling. The container thus has an electromagnetic coupling module that includes a radio IC chip that is resistant to a shock applied from the outside and an environmental change, realizes an easy arrangement of a radiator and the electromagnetic coupling module, provides a preferable radiation characteristic, and is suitably used in an RFID system.

8 Claims, 3 Drawing Sheets

U.S. PATENT DOCUMENTS

| | | |
|---|---|---|
| 6,181,287 B1 | 1/2001 | Beigel |
| 6,190,942 B1 | 2/2001 | Wilm et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,828,881 B2 | 12/2004 | Mizutani et al. |
| 6,927,738 B2 | 8/2005 | Senba et al. |
| 6,963,729 B2 | 11/2005 | Uozumi |
| 6,975,834 B1 | 12/2005 | Forster |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2002/0011967 A1 | 1/2002 | Goff et al. |
| 2002/0044092 A1 | 4/2002 | Kushihi |
| 2002/0067316 A1 | 6/2002 | Yokoshima et al. |
| 2003/0020661 A1 | 1/2003 | Sato |
| 2003/0206107 A1 | 11/2003 | Goff et al. |
| 2004/0001027 A1 | 1/2004 | Killen et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0252700 A1 | 11/2007 | Ishihara et al. |
| 2007/0285335 A1 | 12/2007 | Bungo et al. |
| 2008/0024156 A1 | 1/2008 | Arai et al. |
| 2008/0087990 A1 | 4/2008 | Kato et al. |
| 2008/0169905 A1 | 7/2008 | Slatter |
| 2008/0272885 A1 | 11/2008 | Atherton |
| 2009/0002130 A1 | 1/2009 | Kato |

FOREIGN PATENT DOCUMENTS

| | | |
|---|---|---|
| EP | 0 977 145 A2 | 2/2000 |
| JP | 50-143451 A | 11/1975 |
| JP | 62-127140 U | 8/1987 |
| JP | 03-262313 A | 11/1991 |
| JP | 04-150011 A | 5/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 11-149537 A | 6/1996 |
| JP | 08-176421 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-245381 A | 9/1997 |
| JP | 09-252217 A | 9/1997 |
| JP | 09-270623 A | 10/1997 |
| JP | 9-512367 A | 12/1997 |
| JP | 10-069533 A | 3/1998 |
| JP | 10-505466 A | 5/1998 |
| JP | 10-171954 A | 6/1998 |
| JP | 10-293828 A | 11/1998 |
| JP | 11-039441 A | 2/1999 |
| JP | 11-085937 A | 3/1999 |
| JP | 11-149538 A | 6/1999 |
| JP | 11-219420 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-148948 A | 5/2000 |
| JP | 2000-172812 A | 6/2000 |
| JP | 2000-510271 A | 8/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 3075400 U | 11/2000 |
| JP | 2001-028036 A | 1/2001 |
| JP | 2007-18067 A | 1/2001 |
| JP | 2001-043340 A | 2/2001 |
| JP | 2001-66990 A | 3/2001 |
| JP | 2001-505682 A | 4/2001 |
| JP | 2001-168628 A | 6/2001 |
| JP | 2001-240046 A | 9/2001 |
| JP | 2001-256457 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-344574 A | 12/2001 |
| JP | 2001-351084 A | 12/2001 |
| JP | 2001-352176 A | 12/2001 |
| JP | 2002-024776 A | 1/2002 |
| JP | 2002-042076 A | 2/2002 |
| JP | 2002-063557 A | 2/2002 |
| JP | 2002-505645 A | 2/2002 |
| JP | 2002-76750 A | 3/2002 |
| JP | 2002-150245 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-522849 A | 7/2002 |
| JP | 2002-230128 A | 8/2002 |
| JP | 2002-252117 A | 9/2002 |
| JP | 2002-298109 A | 10/2002 |
| JP | 2002-319008 A | 10/2002 |
| JP | 2002-362613 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-030612 A | 1/2003 |
| JP | 2003-44789 A | 2/2003 |
| JP | 2003-046318 A | 2/2003 |

| | | |
|---|---|---|
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-187207 A | 7/2003 |
| JP | 2003-187211 A | 7/2003 |
| JP | 2003-188338 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-288560 A | 10/2003 |
| JP | 2003-309418 A | 10/2003 |
| JP | 2003-332820 A | 11/2003 |
| JP | 2004-082775 A | 3/2004 |
| JP | 2004-88218 A | 3/2004 |
| JP | 2004-096566 A | 3/2004 |
| JP | 2004-253858 A | 9/2004 |
| JP | 2004-287767 A | 10/2004 |
| JP | 2004-297249 A | 10/2004 |
| JP | 2004-297681 A | 10/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-124061 A | 5/2005 |
| JP | 2005-136528 A | 5/2005 |
| JP | 2005-165839 A | 6/2005 |
| JP | 2005-167327 A | 6/2005 |
| JP | 2005-190417 A | 7/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-275870 A | 10/2005 |
| JP | 2005-295135 A | 10/2005 |
| JP | 2005-311205 A | 11/2005 |
| JP | 2005-321305 A | 11/2005 |
| JP | 2005-335755 A | 12/2005 |
| JP | 2005-345545 A | 12/2005 |
| JP | 2005-346820 A | 12/2005 |
| JP | 2005-352858 A | 12/2005 |
| JP | 2006-031766 A | 2/2006 |
| JP | 2006-39902 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-148518 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-232292 A | 9/2006 |
| JP | 2006-270212 A | 10/2006 |
| JP | 2006-302219 A | 11/2006 |
| JP | 2006-309401 A | 11/2006 |
| JP | 2007-043535 A | 2/2007 |
| JP | 2007-65822 A | 3/2007 |
| JP | 2007-122542 A | 5/2007 |
| JP | 2007-150868 A | 6/2007 |
| JP | 11-175678 A | 1/2009 |
| NL | 9100176 A | 3/1992 |
| NL | 9100347 A | 3/1992 |
| WO | 00/10122 A2 | 2/2000 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/115849 A1 | 12/2005 |
| WO | 2006/045682 A | 5/2006 |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117; filed Dec. 2, 2008.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.

Dokai et al.: "Optical Disc"; U.S. Appl. No. 12/326,916, filed Dec. 3, 2008.

Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.

Kato: "Wireless IC Device"; U.S. Appl. No. 11/964,185, filed Dec. 26, 2007.

Kato et al.: "Radio Frequency IC Device"; U.S. Appl. No. 12/336,629, filed Dec. 17, 2008.

Kato et al.: "Wireless IC Device and Component for Wireless IC Device"; U.S. Appl. No. 12/339,198, filed Dec. 19, 2008.

Ikemoto et al.: "Wireless IC Device"; U.S. Appl. No. 11/851,651, filed Sep. 7, 2007.

Kataya et al.: "Wireless IC Device and Electronic Device"; U.S. Appl. No. 11/851,661, filed Sep. 7, 2007.

Dokai et al.: "Antenna and Radio IC Device"; U.S. Appl. No. 12/350,307, filed Jan. 8, 2009.

Official Communication issued in corresponding Japanese Patent Application No. 2008-555098, mailed on Jun. 7, 2011.

CONTAINER WITH ELECTROMAGNETIC COUPLING MODULE

BACKGROUND OF THE INVENTION

1. Field of the Invention

The present invention relates to containers with electromagnetic coupling modules, and more specifically, to a container with an electromagnetic coupling module having a radio IC chip used in an RFID (Radio Frequency Identification) system.

2. Description of the Related Art

Recently, RFID systems, in which a reader/writer that generates an induction field contactlessly communicates with an IC chip (also referred to as an IC tag or a radio IC chip) that is attached to an article or a container and stores predetermined information to exchange information, have been developed as article management systems. For example, Japanese Unexamined Patent Application Publication No. 2003-67711 discloses an article having an electrically conductive antenna unit and an IC chip that are provided on an outer surface of a packaging container, such as a side surface or an upper surface of a cardboard box.

However, attachment of the antenna unit and the IC chip onto the outer surface of the packaging container has a problem in which the IC chip may be damaged by a shock caused when the IC chip is hit by another article during packaging, transfer, and/or storage. Additionally, the antenna unit and the IC chip must be arranged to overlap each other in an electrically conductive manner. Since the displacement in the overlapping state causes trouble in the transmission and reception quality of signals, it causes a problem in which high accuracy is required in the arrangement. Furthermore, since the IC chip is provided on a signal radiating surface of the antenna unit, there is also a problem that the IC chip disturbs a signal radiation characteristic of the antenna unit.

SUMMARY OF THE INVENTION

To overcome the problems described above, preferred embodiments of the present invention provide a container with an electromagnetic coupling module that includes a radio IC chip that 1) is resistant to a shock applied from the outside or due to an environmental change, 2) realizes an easy arrangement of a radiator and the electromagnetic coupling module, 3) provides a preferable radiation characteristic, and 4) is suitably used in an RFID system.

To achieve the above-described characteristics and advantages, a container with an electromagnetic coupling module according to a preferred embodiment of the present invention includes an electromagnetic coupling module having a radio IC chip and a feeder circuit board on which the radio IC chip is mounted, the feeder circuit board including a feeder circuit having a resonant circuit that includes an inductance element and which has a predetermined resonant frequency, and a radiator that is electromagnetically coupled to the feeder circuit board, wherein the electromagnetic coupling module is attached to an inner surface of the container, and the radiator is attached to an outer surface of the container, such that the radiator radiates a transmission signal supplied from the resonant circuit through electromagnetic coupling and/or supplies a reception signal to the resonant circuit through electromagnetic coupling.

In a container with an electromagnetic coupling module according to a preferred embodiment of the present invention, the electromagnetic coupling module preferably includes the radio IC chip and the feeder circuit board. The electromagnetic coupling module and the radiator are arranged to be electromagnetically coupled with one another. Since the electromagnetic coupling module and the radiator are not directly electrically coupled, but rather are electromagnetically coupled with one another, the electromagnetic coupling module and the radiator work even if the electromagnetic coupling module and the radiator are respectively attached to the inner and outer surfaces of the container. Since the electromagnetic coupling module does not have to be arranged in a highly accurate manner with respect to the radiator, the arrangement process is significantly simplified.

Since transmission and reception of high-frequency signals with a reader/writer are preferably performed by providing the radiator on the outer side, an operation distance can become increased and an operation reliability is improved. On the other hand, since the electromagnetic coupling module is provided on the inner surface of the container, the electromagnetic coupling module is not affected by either a shock applied from the outside and an effect of an environmental change, such as humidity and temperature, for example, on the radio IC chip is reduced.

Additionally, since a frequency of a transmission signal radiated from the radiator and a frequency of a reception signal to be supplied to the radio IC chip are substantially determined by a resonant frequency of the resonant circuit of the feeder circuit board, various shapes of the radiator can be used and a stable frequency characteristic can be obtained.

Furthermore, since the electromagnetic coupling module is not arranged in front of the radiator, the signal radiation characteristic is not disturbed and a communication failure is less likely to occur. Furthermore, the container itself functions as a radiator even if the radiator is damaged or falls off. Accordingly, a function of the RFID system does not stop, even though the radiation characteristic may be worsened. In this regard, the container is preferably made of a dielectric. Herein, the dielectric is a material having a dielectric constant equal to or greater than about 1. By adjusting characteristic impedance of an input/output portion of the electromagnetic coupling module to match characteristic impedance around an interface of the dielectric, an electromagnetic wave is input to the dielectric and the dielectric functions as an electromagnetic radiator. The container may preferably be made of paper, cardboard, polyethylene, polypropylene, polyamide, cellophane, and polyethylene terephthalate, for example.

In a container with including an electromagnetic coupling module according to a preferred embodiment of the present invention, the radiator may preferably be attached to the outer surface of the container through an adhesive layer or may be directly defined on the outer surface of the container. When conductive resin paste including metal particles is applied onto the outer surface of the container, the radiator can be securely attached to the container. In this case, when the container is made of paper, a degree of adhesion between the radiator and the container increases and bleeding can be minimized. The radiator may preferably be a metal film or a metal leaf, for example.

The radio IC chip may preferably store various kinds of information regarding contents of the container with the electromagnetic coupling module. The information may preferably be writable. The radio IC chip may preferably have an information processing function other than that for the RFID system.

According to preferred embodiments of the present invention, a radio IC chip is resistant to shock applied from the outside and an environmental change, high accuracy is not required in the arrangement of a radiator and an electromagnetic coupling module and attachment thereof is easy, and an improved radiation characteristic and a stable frequency characteristic can be obtained.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of a container with an electromagnetic coupling module according to the present invention will be described below with reference to the accompanying drawings. The same reference numerals are used for components and portions common to various electromagnetic coupling modules and various articles to be described below and a repeated description will be omitted.

First and Second Preferred Embodiments

Figure 1:
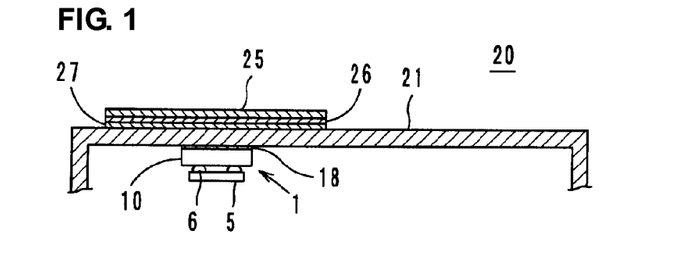
FIG. 1 is a sectional view showing a first preferred embodiment of a container with an electromagnetic coupling module according to the present invention.

FIG. 1 shows a first preferred embodiment of a container 20 with an electromagnetic coupling module 1. In the container 20, an electromagnetic coupling module 1 (to be described in detail later) including a feeder circuit board 10 on which a radio IC chip 5 is mounted is adhered to an inner surface of a container main body 21 through an adhesive layer 18 and a radiator 25 is attached to an outer surface of the container main body 21 so as to oppose the electromagnetic coupling module 1. The container main body 21 could have any one of various preferred shapes, such as a box shape, a bag shape, a bottle shape, for example. The container main body 21 could preferably be made of any desired material, including paper, cardboard, polyethylene, polypropylene, polyamide, cellophane, and polyethylene terephthalate, for example. The thickness of the container main body is preferably equal to or less than about 10 mm.

The radiator 25 is preferably formed by providing aluminum foil, copper foil, or a metal plating film, such as Al, Cu, or Ag, for example, on a resin film 26 and is adhered to the container main body 21 through an adhesive layer 27. Polyethylene terephthalate, polyimide, and polyester, for example, can preferably be used as the resin film 26.

Figure 2:
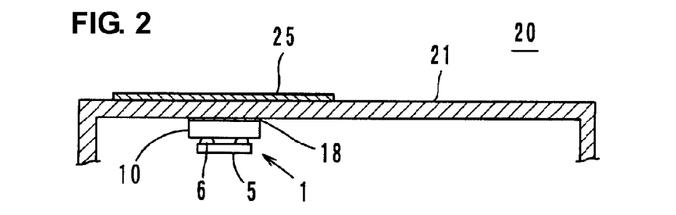
FIG. 2 is a sectional view showing a second preferred embodiment of a container with an electromagnetic coupling module according to the present invention.

FIG. 2 shows a second preferred embodiment of a container 20 with an electromagnetic coupling module 1. The container 20 differs from the first preferred embodiment in that a radiator 25 is directly defined on an outer surface of a container main body 21. The remaining configuration is substantially the same as that of the first preferred embodiment. Here, the radiator 25 is preferably formed by applying conductive resin paste onto the outer surface of the container main body 21 and then drying/setting the conductive resin paste. For example, conductive resin paste composed of about 50-90 weight percent of metal particles, such as Ag and Cu, for example, and the rest of weight percent of epoxy-series resin and solvent, for example, such as BC/BCA, is applied by flexography, screen printing, and a dispenser to form the radiator 25. Alternatively, low-viscosity conductive resin paste composed of about 20-50 weight percent of metal particles, such as Ag and Cu, and the rest of weight percent of cellulose resin and solvent, such as BCA, is applied using an inkjet method to form the radiator 25.

Figure 3:
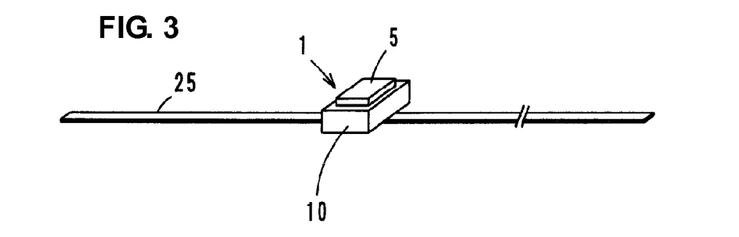
FIG. 3 is a schematic perspective view showing a first example of a radiator according to a preferred embodiment of the present invention.
Figure 4:
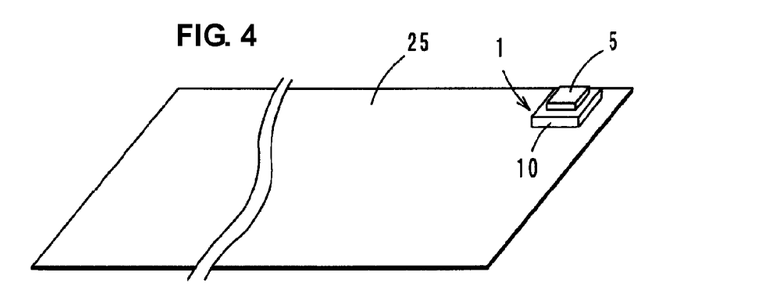
FIG. 4 is a schematic perspective view showing a second example of a radiator according to a preferred embodiment of the present invention.
Figure 5:
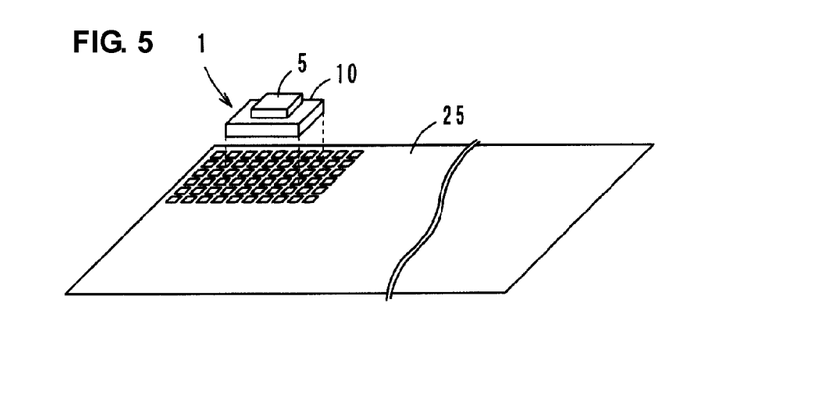
FIG. 5 is a schematic perspective view showing a third example of a radiator according to a preferred embodiment of the present invention.

The radiator 25 may preferably be linear or substantially linear as shown in FIG. 3 or may preferably have a broad area as shown in FIG. 4. Alternatively, as shown in FIG. 5, at least a portion of the radiator opposing the electromagnetic coupling module 1 may be arranged like a mesh. FIGS. 3-5 illustrate shapes of the radiator 25 and are schematic diagrams in which the container main body 21 provided between the radiator 25 and the electromagnetic coupling module 1 is omitted.

The electromagnetic coupling module 1 and the radiator 25 may be attached to the container main body 21 in a process of manufacturing of the container 20 or after completion of the container 20.

In the first and second preferred embodiments, because the electromagnetic coupling module 1 and the radiator 25 are adhered to surfaces of the container main body 21, the electromagnetic coupling module and the radiator are securely adhered. In particular, since the radiator 25 is extremely thin, the radiator does not protrude from the outer surface of the container main body 21 and is less likely to easily fall off due to a contact with another material.

In particular, if the container main body 21 is made of cardboard, such as paper, for example, adhesion reliability of the electromagnetic coupling module 1 and the radiator 25 is increased because surfaces of paper have unevenness and an anchor effect to an adhesive is obtained. In addition, as in the second preferred embodiment, since the paste is absorbed by paper when the radiator 25 is formed by applying low-viscosity conductive resin paste, bleeding and crawling are not caused.

Electromagnetic Coupling Module

Figure 6:
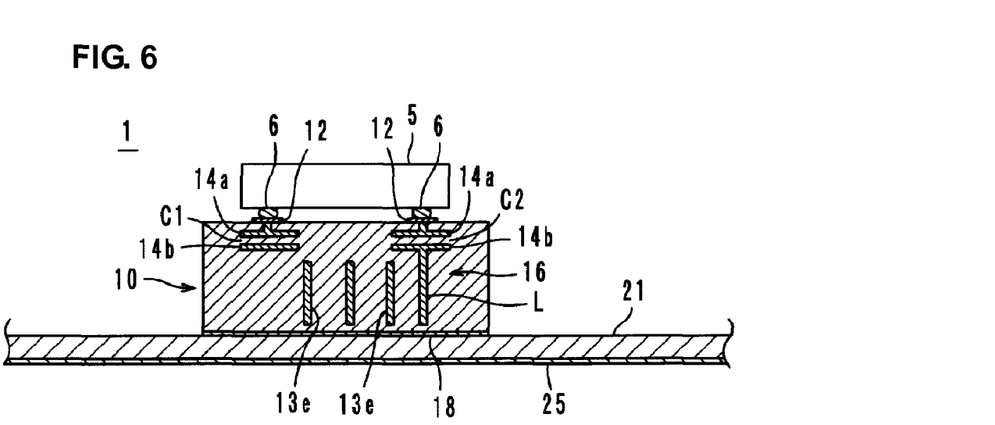
FIG. 6 is a sectional view showing an electromagnetic coupling module according to a preferred embodiment of the present invention.

As shown in FIG. 6, an electromagnetic coupling module 1 preferably includes a radio IC chip 5 and a feeder circuit board 10 on which the radio IC chip 5 is mounted. The radio IC chip 5 preferably includes a clock circuit, a logic circuit, and a memory circuit, stores necessary information, and is electrically connected to a resonant circuit 16 included in the feeder circuit board 10 through solder bumps 6. As described below, the electromagnetic coupling module 1 and the radiator 25 are electromagnetically coupled through the container main body 21 and the adhesive layer 27.

Figure 7:
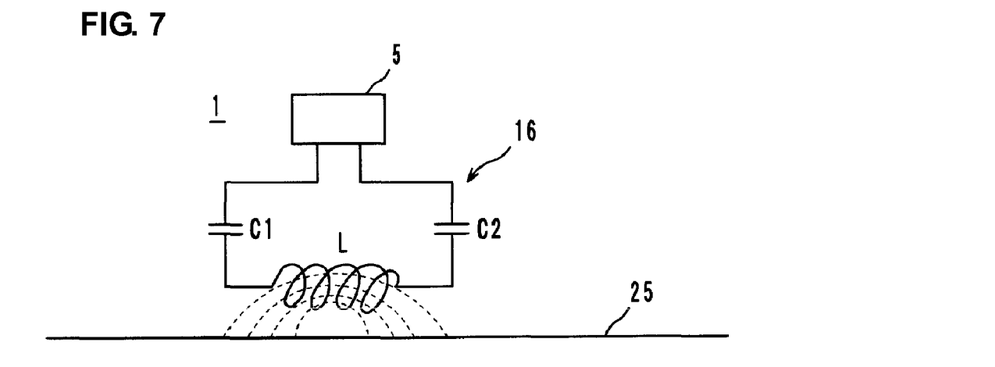
FIG. 7 is an equivalent circuit diagram of an electromagnetic coupling module according to a preferred embodiment of the present invention.

The resonant circuit 16 is a circuit arranged to supply a transmission signal having a predetermined frequency to the radiator 25 and/or a circuit arranged to select a reception signal having a predetermined frequency from signals received by the radiator 25 and to supply the selected reception signal to the radio IC chip 5, and to resonate at a predetermined frequency. As shown in FIG. 6 and FIG. 7, the resonant circuit 16 is preferably defined by a lumped-constant LC-series resonant circuit including a helical inductance element L and capacitance elements C1 and C2.

Figure 8:
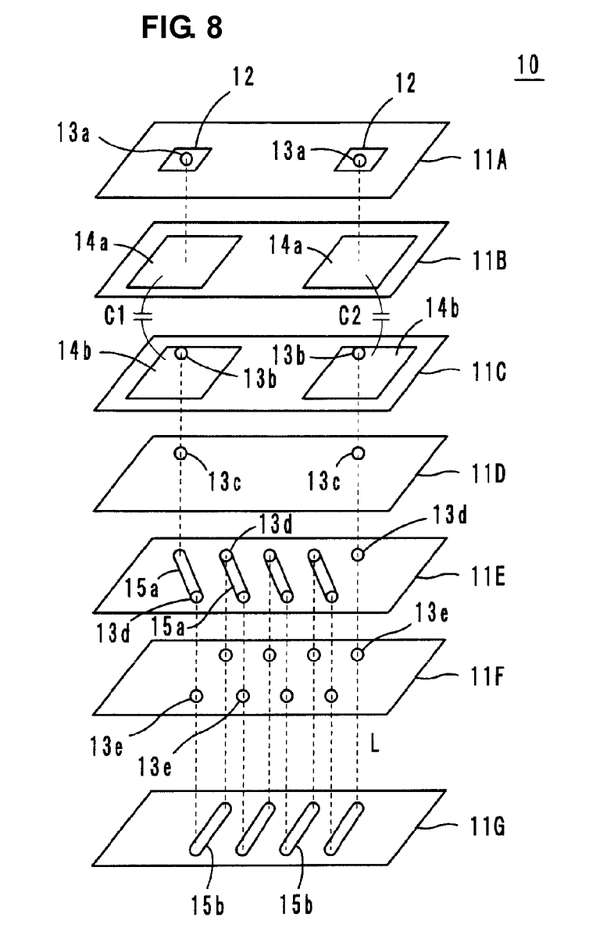
FIG. 8 is an exploded perspective view showing a feeder circuit board according to a preferred embodiment of the present invention.

More specifically, as shown in FIG. 8, the feeder circuit board 10 is preferably formed by laminating, press-bonding, and burning dielectric ceramic sheets 11A-11G. The feeder circuit board preferably includes the sheet 11A having connection electrodes 12 and via-hole conductors 13a, the sheet 11B having capacitor electrodes 14a, the sheet 11C having capacitor electrodes 14b and via-hole conductors 13b, the sheet 11D having via-hole conductors 13c, the sheet E having conductor patterns 15a and via-hole conductors 13d, the sheet 11F (of which there could be one or more) having via-hole conductors 13e, and the sheet 11G having conductor patterns 15b. Each of the ceramic sheets 11A-11G may be a sheet made of a magnetic ceramic material. The feeder circuit board 10 can be readily obtained using a conventionally used multilayer board manufacturing method, such as a sheet lamination method and a thick film screen printing method, for example.

By laminating the above-described sheets 11A-11G, the inductance element L having a helical axis parallel or substantially parallel to the radiator 25 and the capacitance elements C1 and C2, in which the capacitor electrodes 14b are connected to respective ends of the inductance element L and the capacitor electrodes 14a are connected to the connection electrodes 12 through the via-hole conductors 13a, are defined. The connection electrodes 12 defining board-side electrode patterns are electrically connected to terminals (see FIG. 9) of the radio IC chip 5 through the solder bumps 6.

More specifically, the inductance element L defining a coil electrode pattern, among the elements defining the resonant circuit 16, feeds a transmission signal to the radiator 25 through a magnetic field. The inductance element L is fed with a reception signal from the radiator 25 through a magnetic field. Accordingly, it is preferable to arrange the inductance element L, among the inductance element L and the capacitance elements C1 and C2 defining the resonant circuit 16, closer to the radiator 25 in the feeder circuit board 10.

Figure 9A:
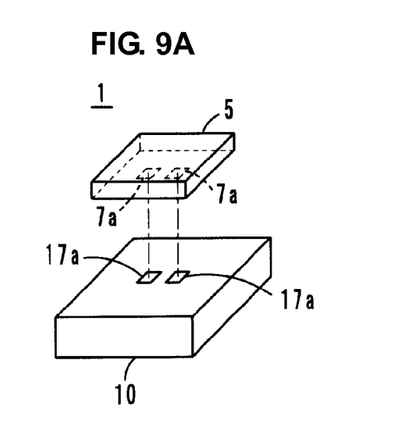
FIGS. 9A and 9B are perspective views showing a connection state of a radio IC chip and a feeder circuit board according to a preferred embodiment of the present invention.
Figure 9B:
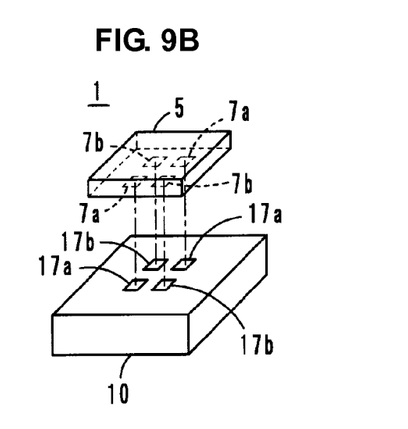

FIGS. 9A and 9B show a connection state of the radio IC chip 5 and the feeder circuit board 10. FIG. 9A shows a state in which a pair of antenna (balance) terminals 7a and a pair of antenna terminals 17a are provided on a back side of the radio IC chip 5 and a front side of the feeder circuit board 10, respectively. FIG. 9B shows another connection state in which a pair of antenna (balance) terminals 7a and a pair of antenna terminals 17a and a pair of ground terminals 7b and a pair of ground terminals 17b are provided on a back side of the radio IC chip 5 and a front side of the feeder circuit board 10, respectively. The ground terminals 17b of the feeder circuit board 10 is terminated and are not connected to other elements of the feeder circuit board 10.

FIG. 7 shows an equivalent circuit of the electromagnetic coupling module 1. This electromagnetic coupling module 1 receives high-frequency signals (e.g., UHF frequency band) radiated from a reader/writer, not shown, with the radiator 25, resonates the resonant circuit 16 (an LC-series resonant circuit including the inductance element L and the capacitance elements C1 and C2) that is mainly magnetically coupled to the radiator 25, and supplies only a reception signal of a predetermined frequency band to the radio IC chip 5. On the other hand, the electromagnetic coupling module extracts predetermined energy from this reception signal, adjusts information stored in the radio IC chip 5 to have a predetermined frequency in the resonant circuit 16 using this energy as a driving source, then propagates the transmission signal to the radiator 25 from the inductance element L through magnetic coupling, and transmits and transfers the transmission signal to the reader/writer from the radiator 25.

Although coupling between the resonant circuit 16 and the radiator 25 is primarily coupling through a magnetic field, coupling through an electric field may preferably also coexist. "Electromagnetic coupling" indicates coupling through an electric field and/or a magnetic field.

In the resonant circuit 16, a resonant frequency is determined by a resonant circuit constituted by the inductance element L and the capacitance elements C1 and C2. A resonant frequency of a signal radiated from the radiator 25 is substantially determined by a self-resonance frequency of the resonant circuit 16. Accordingly, any desired shape can be used for the radiator 25. A relative location of the electromagnetic coupling module 1 with respect to the radiator 25 is freely determined. Accordingly, an adhesion position of the electromagnetic coupling module 1 does not have to be managed highly accurately.

Since the electromagnetic coupling module 1 is not arranged in front of the radiator 25, a signal radiation characteristic is not disturbed and a communication failure is much less likely to occur. Since the container main body 21 is preferably made of a dielectric, it functions as a radiator even if the radiator 25 is damaged or falls off, and a function of an RFID system does not stop though the radiation characteristic worsens more or less.

Furthermore, since the helical axis of the coil electrode patterns defining the inductance element L is arranged in parallel or substantially in parallel to the radiator 25, advantageously, the center frequency does not vary. Additionally, since the capacitance elements C1 and C2 are arranged at the following stage of the radio IC chip 5, low-frequency serge can be cut by the elements C1 and C2 and the radio IC chip 5 can be protected from the surge.

The resonant circuit 16 also has a function of a matching circuit and is arranged to match impedance of the radio IC chip 5 and impedance of the radiator 25. The feeder circuit board 10 may include a matching circuit, having an inductance element and a capacitance element, provided separately from the resonant circuit. When a function of a matching circuit is included in the resonant circuit 16, a design of the resonant circuit 16 tends to be complicated. If a matching circuit is provided separately from the resonant circuit 16, the resonant circuit and the matching circuit can be designed independently.

A container with an electromagnetic coupling module according to the present invention is not limited to the above-described preferred embodiments and can be modified variously within the scope of the present invention.

In particular, a shape of a container having an electromagnetic coupling module attached thereto is not limited to a box shape as shown in the preferred embodiments. The electromagnetic coupling module can be attached to various kinds of containers. The electromagnetic coupling module and a radiator do not have to be arranged to oppose each other. In addition, a detail of an internal configuration of a feeder circuit board and a detailed shape of the radiator may be freely determined. The feeder circuit board may be formed of a flexible material. Furthermore, processing other than solder bumps may be used to mount a radio IC chip on the feeder circuit board.

As described above, the present invention is useful for a container with an electromagnetic coupling module. In particularly, the present invention is advantageous in that a radio IC chip is resistant to a shock applied from the outside and an environmental change, a radiator and an electromagnetic coupling module are arranged easily, and a radiation characteristic is preferable.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A container comprising:
   an electromagnetic coupling module including a radio IC chip and a feeder circuit board on which the radio IC chip is mounted, the feeder circuit board including a feeder circuit including a resonant circuit that includes an inductance element and has a predetermined resonant frequency; and
   a radiator that is electromagnetically coupled to the inductance element of the feeder circuit board; wherein
   the feeder circuit board is defined by a multilayer board and the resonant circuit of the feeder circuit is disposed within the multilayer board;
   the electromagnetic coupling module is attached to an inner surface of the container;
   the radiator is attached to an outer surface of the container, and the radiator is arranged to radiate a transmission signal supplied from the resonant circuit through electromagnetic coupling and/or to supply a reception signal to the resonant circuit through electromagnetic coupling.

2. The container according to claim 1, wherein the radiator is attached to the outer surface of the container through an adhesive layer.

3. The container according to claim 1, wherein the radiator is directly disposed on the outer surface of the container.

4. The container according to claim 1, wherein at least a portion of the container on which the electromagnetic coupling module and the radiator are provided is made of a dielectric material.

5. The container according to claim 4, wherein the dielectric is one of paper, cardboard, polyethylene, polypropylene, polyamide, cellophane, or polyethylene terephthalate.

6. The container according to claim 1, wherein a portion of the container on which the radiator is provided is made of paper.

7. The container according to claim 1, wherein the radiator is one of a metal film or a metal leaf provided on a resin film.

8. The container according to claim 7, wherein the metal film is made of conductive resin paste including a metal particle.

* * * * *